United States Patent [19]

Yamamoto et al.

[11] Patent Number: 4,626,889
[45] Date of Patent: Dec. 2, 1986

[54] STACKED DIFFERENTIALLY DRIVEN TRANSMISSION LINE ON INTEGRATED CIRCUIT

[75] Inventors: Masakazu Yamamoto, Kodaira; Akira Masaki; Ryotaro Kamikawai, both of Tokyo, all of Japan

[73] Assignee: Hitachi, Ltd., Tokyo, Japan

[21] Appl. No.: 682,938

[22] Filed: Dec. 18, 1984

[30] Foreign Application Priority Data

Dec. 23, 1983 [JP] Japan .................. 58-242009

[51] Int. Cl.⁴ .............. H01L 23/52; H01P 3/08; H01P 3/18
[52] U.S. Cl. .................... 357/71; 307/443; 333/238; 333/246; 357/51; 357/68
[58] Field of Search .............. 307/443; 333/1, 238, 333/246; 357/71, 68, 51

[56] References Cited

U.S. PATENT DOCUMENTS

| | | | |
|---|---|---|---|
| 3,329,835 | 7/1967 | D'Agostino | 307/443 |
| 3,543,198 | 11/1970 | Stopper | 333/246 |
| 3,723,761 | 3/1973 | Masaki | 307/443 |
| 3,742,468 | 6/1973 | Lode | 307/443 |
| 4,383,227 | 5/1983 | de Ronde | 333/246 |
| 4,412,335 | 10/1983 | Froment et al. | 307/443 |

FOREIGN PATENT DOCUMENTS 59-4231 1/1984 Japan .

OTHER PUBLICATIONS

Seki et al, IECE (Japan) General Meeting S3-3, 1982, pp. 2-231 to 2-232.
Lewis, Proceedings 29th Electronic Components Conference (IEEE, May 1979), pp. 85-93.
Howe, Jr., *Stripline Circuit Design* (Artech House, Dedham, Mass., 1974), pp. 111-151 (Chapter 4).

*Primary Examiner*—William D. Larkins
*Attorney, Agent, or Firm*—Antonelli, Terry & Wands

[57] ABSTRACT

A semiconductor integrated circuit structure including a semiconductor substrate having a large area adapted for a large scale integration, a circuit formed in the substrate for generating a pair of complementary signals, a pair of common potential level layers with an electrically insulating layer interposed therebetween, the common potential level layers being formed above and being electrically insulated from the substrate, and a pair of electric conductor pattern layers formed in the insulating layer for conducting the pair of complementary signals. The electric conductor pattern layers are arranged so as to be overlapped with each other in a direction substantially perpendicular to the large area substrate and so as to be substantially parallel with the large area substrate. The overall length of the electric conductor pattern layers is such that when an electric signal is conducted through an electric conductor in an IC having a length equal to the above-mentioned overall length, attenuation of the signal thereby is not negligible.

6 Claims, 11 Drawing Figures

STACKED DIFFERENTIALLY DRIVEN TRANSMISSION LINE ON INTEGRATED CIRCUIT

BACKGROUND OF THE INVENTION

This invention relates to semiconductor integrated circuits and more particularly to an improvement of the structure of a high speed, large scale semiconductor integrated circuit device.

The conventional signal transmission or conduction in a semiconductor integrated circuit device is carried out with the so-called near end termination in which a termination resistor is connected in the neighbourhood of the output terminal of a circuit of generating the signal, i.e., the termination resistor is connected with the signal generation side terminal of a wiring conductor. This mode of signal transmission increases a propagation delay time in proportion to a square of a wiring conductor length, as is well known. The broken line curve 1 of FIG. 1 illustrates the above-mentioned delay in the signal transmission. The drawing teaches that as the length of the wiring conductor becomes larger, the signal transmission with the near end termination will be very disadvantageous as compared with the signal transmission with the far end termination represented by the broken line curve 2 in which a termination resistor is connected with the receiving side terminal of the wiring conductor. This signal transmission with the far end termination has only been employed in a printed board or the like. The wiring conductor has a resistance r equal to 10 Ω/cm and a capacitance C with respect to the ground equal to 4 pF/cm and undergoes a propagation delay time $T_d$ equal to 66 psec/cm for the far end termination.

Moreover, in order to use the far end termination, the resistance of the wiring conductor must be reduced since a large resistance thereof provides a small amplitude of the signal at the receiving end, which leads to the shortage of margin. The solid lines 3 and 4 in FIG. 1 illustrate a high level signal and a low level signal, varying dependent on the wiring conductor length with the far end termination employed. These high and low level signals are generated by an emitter coupled logic circuit. Thus, with the wiring conductor resistance (r) equal to 10 Ω/cm and the termination resistance equal to 50 Ω, the amplitude of the signal at the receiving end of the wiring conductor 10 cm long. is reduced to ½ that at the sending end, which is no longer effective for normal operation of the circuit.

One countermeasure of obviating the reduction of the signal amplitude is proposed in Japanese Patent Application Kokai (Laid-Open) No. 59-4231 (laid-open on Jan. 11, 1984 and corresponding to an earlier Japanese Patent Application No. 57-111730 filed June 30, 1982), for example, in which complementary signals are generated and transmitted or conducted to drive a differential circuit so as to provide a signal with an amplitude effectively doubled. FIG. 2 shows an example of an emitter coupled logic circuit on the basis of the above idea. Namely, two complementary signals (OR output signal 5, NOR output signal 6) in the first circuit on the left side are employed to drive the second circuit on the right side. This circuit structure enables the second circuit to normally operate with the voltage between these two signals as large as about several tens of mV.

Conventionally, however, for such a pair of wiring conductors for conducting the complementary signals in the signal transmission, there has been considered such a structure that above a GaAs substrate (not shown) respective wiring conductors 7 and 8 for transmitting or conducting the complementary two signals lie on the same plane in parallel to powering/grounding layers, i.e., common potential level layers 9, as seen from FIGS. 3a and 3b. This structure is disclosed in the paper by Seki et al "General Meeting S3-3 for The Institute of Electronics and Communication Enginners of Japan pp. 2–331 and 2–332", for example. This structure of wiring conductors provides a weak electromagnetic coupling between the pair of wiring conductors 7 and 8, which result in the inconvenience of large crosstalk between the pair of the above wiring conductors 7 and 8 and another pair of wiring conductors adjacent thereto (not shown). For a multi-layer structure, use of the above-mentioned arrangement of the wiring conductor pairs requires that the powering/growing layers 9 be provided by all means for the purpose of preventing the crosstalk between the upper and lower wiring conductor pairs as shown in FIG. 3B, which gives rise to a problem of the increase of the number of layers.

SUMMARY OF THE INVENTION

An object of this invention is to provide a semiconductor integrated circuit structure having such a wiring conductor structure as conducting, with suppressed crosstalk, a pair of complementary signals to a predetermined location on a semiconductor IC substrate having an area as large as 1 cm–10 cm square.

In accordance with one of the important aspects of the present invention, at least circuit means for generating a pair of complementary signals is formed in a semiconductor substrate having such a large area as being adapted for a large scale integration, a pair of powering/grounding layers or common potential level layers electrically insulated from the substrate are formed above the substrate with an electrically insulating layer interposed therebetween, a pair of electric conductor pattern layers in electrical connection with the circuit means are formed in the insulating layer, and the pair of conductor patter layers are arranged in a spaced relation with each other, so as to be overlapped with each other in a direction substantially perpendicular to the powering/grounding layers or the substrate and so as to be substantially parallel with the powering/grounding layer or the substrate, whereby the electromagnetic coupling between the conductor pattern layers are made large to reduce the crosstalk with other conductor pattern layers within the insulating layer.

DESCRIPTION OF THE PREFERRED EMBODIMENTS

Figure 4:
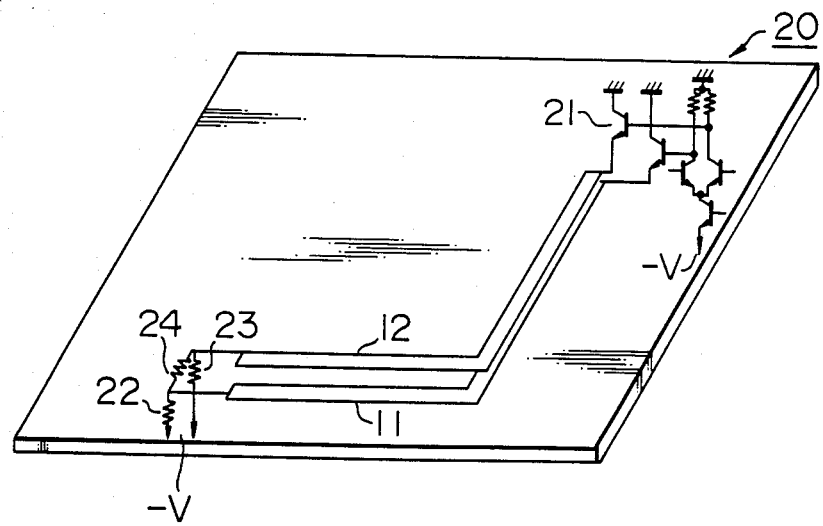
FIG. 4 is a schematic representation of a semiconductor integrated circuit structure according to one embodiment of this invention.

FIG. 4 is a schematic representation of a semiconductor integrated circuit structure 20 according to one embodiment of this invention. In this drawing, a semiconductor substrate of, e.g., Si or GaAs, including a circuit device 21 for generating a pair of complementary signals, has such a large area as to be adapted for a large scale integration (for example, 1 cm-10 cm square). A pair of powering/grounding layers (common potential level layers) of, e.g., Al, Cu, Ag or Au, are formed above the substrate by, e.g., evaporation or plating technique and patterning by etching and are electrically insulated therefrom through an evaporation film of, e.g., $SiO_2$ or $Si_3N_4$. As will be explained in detail later, an electrically insulating layer is formed between the pair of powering/grounding layers, and a pair of wiring conductor pattern layers 11 and 12 are formed in the insulating layer by process similar to that for the powering/grounding layers. The wiring conductor pattern layers provide for conducting a pair of complementary signals generated from the circuit device 21 to any desired position or point on the structure 20. Resistors 22, 23 and 24 are termination resistances, respectively. Although these resistors are not indispensable to this invention, they are desired to be provided to suppress reflection when a pair of complementary signals are conducted from the signal generating circuit device 21 to a desired point on a large area such as a large scale integrated circuit structure. Namely, the resistors 22 and 23 are of the values equal to the characteristic impedances of the wiring conductor pattern layers 11, 12, respectively, while the resistor 24 is of the value equal to the characteristic impedance between the wiring conductor pattern layers 11 and 12.

Figure 5A:
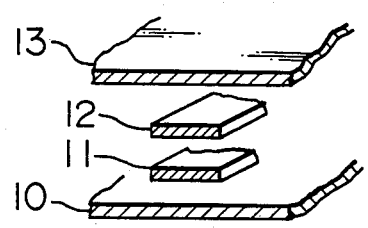
FIGS. 5A and 5B are diagrams of a wiring conductor structure in one embodiment of this invention, respectively.
Figure 5B:
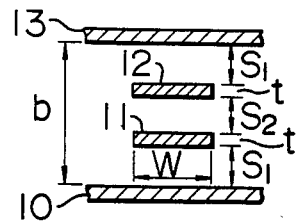

FIGS. 5A and 5B are cross sections of a principal structure of wiring in one embodiment of this embodiment, respectively. As seen from the drawings, a powering/grounding layer (common potential level layer) 10 is formed above a substrate (not shown) and electrically insulated therefrom. A wiring conductor pattern layer 11 is formed above the powering/grounding layer 10 through an insulating layer (not shown). Another wiring conductor pattern layer 12 is formed to be overlapped with the wiring conductor pattern layer 11 through the same insulator as the above insulating layer, for example. Another powering/grounding layer 13 is formed above the pattern layer 12 through the same insulator as the above insulating layer, for example. Thus, the wiring conductor pattern layers 11 and 12 are substantially parallel with the substrate or the powering/grounding layers 10 and 13, respectively and overlapped with each other in a direction substantially perpendicular to the substrate or the powering/grounding layers 10 and 13. The wiring structure in this embodiment assures a large area opposed between the wiring conductor patterns 11 and 12, and therefore, provides meritorious effects such that electromagnetic coupling therebetween is large and crosstalk with other wiring conductors adjacent thereto is small. With the respective dimentions of the wiring conductor pattern layers defined as shown in FIG. 5B and the wiring conductor pattern layers formed with values specified in Table 1, for example, the characteristics shown in Table 2 were obtained. Incidentally, as the insulating material among the layers 10-13, a polyimide resin, e.g., PIQ (Polyimide isoindroquinazoline-dione) was used.

TABLE 1

| | |
|---|---|
| Lateral width $w$ of layers 11, 12 | 50 μm |
| Thickness $t$ of layers 11, 12 | 4 μm |
| Distance $b$ between opposed surfaces of layers 10, 13 | 44 μm |
| Distance $S_1$ between opposed surfaces of layers 13, 12 | 12 μm |
| Distance $S_2$ between opposed surfaces of layers 11, 10 | 12 μm |

TABLE 2

| | |
|---|---|
| Resistance of wiring conductor pattern layers | 1.4 Ω/cm |
| Capacitance of wiring conductor pattern layers (with respect to ground) | 2.1 pF/cm |
| Capacitance of wiring conductor pattern layers (between conductor pattern layers) | 1.6 pF/cm |
| Termination resistance (with respect to ground) | 31 Ω |
| Termination resistance (between conductor pattern layers) | 41 Ω |

In Table 2, the resistances of the termination resistors 22, 23 with respect to ground for the wiring conductor pattern layers 11, 12, and the resistance of the termination resistor 24 connected between the wiring conductor patterns are also indicated. These termination resistors were implemented for the far end termination and effective to suppress reflection of the complementary signals. It is well known that the termination resistances should be equal to the characteristic impedances of the wiring conductor pattern layers 11, 12. The termination resistor between the conductor pattern layers is not requisite, but its provision will enhance the effect of suppression of reflection of the signals. These termination resistors may be constituted with diffusion resistors formed in the substrate.

Figure 1:
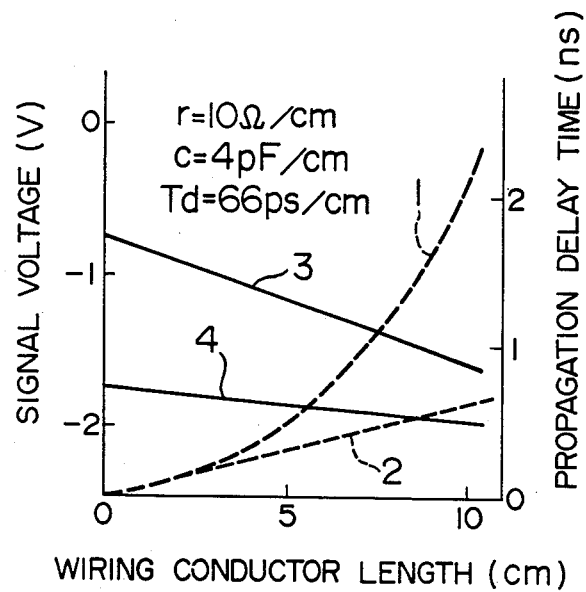
FIG. 1 is a graph showing the relation between wiring conductor lengths, and the voltage of a signal propagating through wiring conductors and a propagation delay time.
Figure 2:
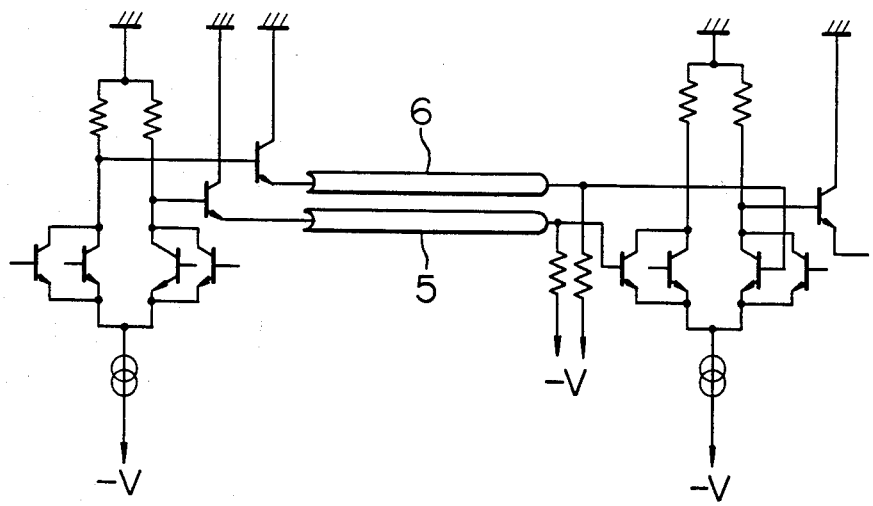
FIG. 2 is a circuit diagram of a circuit comprising differential circuits for generating and transmitting complementary signals and conductors.
Figure 3A:
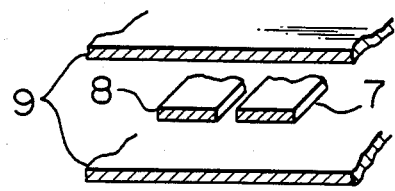
FIGS. 3A and 3B are diagrams of structures for conventional wiring conductors, respectively.

For comparison of crosstalk between two adjacent pairs of conductor pattern layers in semiconductor integrated circuit structures according to an embodiment of the present invention and the prior art, structures having wiring conductor pattern layers were manufactured in accordance with those illustrated in FIGS. 3A and FIG. 5A. Various dimensions are represented by symbols shown in FIGS. 5C and 5D corresponding to FIGS. 3A and 5A, respectively and took the values as specified in Table 3.

TABLE 3

| | |
|---|---|
| $S_1'$ | 12 μm |
| $S_2'$ | 28 μm |
| $t'$ | 4 μm |
| $w'$ | 50 μm |
| $d'$ | 30 μm |
| $b'$ | 44 μm |

Figure 5C:
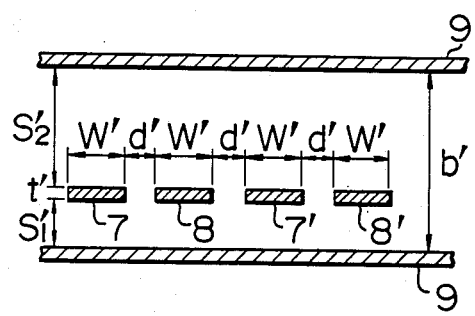
FIGS. 5C and 5D are diagrams for comparison of a structure in one embodiment of this invention with the conventional structure.
Figure 5D:
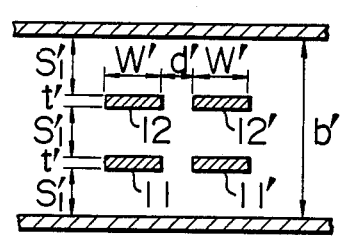

In FIG. 5C, conductor pattern layers 7 and 8 and conductor pattern layers 7' and 8' are paired, respectively each for conducting a pair of complementary signals, while in FIG. 5D, conductor pattern layers 11 and 12 and conductor pattern layers 11' and 12' are paired, respectively, for conducting a pair of complementary signals. The amount of crosstalk to the layer 7' when a pair of complementary signals are conducted through the layers 7 and 8 in FIG. 5C can be deduced from the potential of the layer 7' observed when virtual electric charges are placed on the layers 7 and 8. For example, when virtual electric charges are placed on the layers 7 and 8 such that the voltages of the layers 7 and 8 are +1 V and −1 V, respectively, the potential of the layer 7' is 23 mV. Similarly, in FIG. 5D, when virtual electric charges are placed on the layers 11 and 12 such that the voltages of the layers 11 and 12 are +1 V and −1 V, respectively the potential of the layer 11' is −5 mV, which is almost ¼ that of the layer 7' in absolute value. This means that crosstalk can be effectively suppressed with the structure according to this invention.

Figure 6:
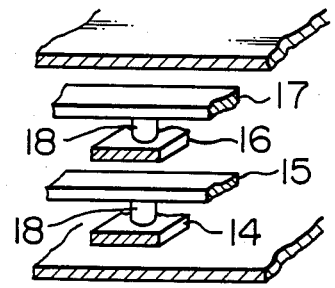
FIG. 6 is a diagram of the wiring conductor structure in another embodiment of this invention.

FIG. 6 shows a wiring conductor structure in another embodiment of this invention in which two pairs of wiring conductor patterns perpendicularly or obliquely crossing each other are arranged. As seen from the drawing, above one wiring conductor pattern layer 14 of the first pair, one wiring conductor pattern layer 15 of the second pair is arranged. The other wiring conductor pattern layer 16 of the first pair and the other wiring conductor pattern 17 are in turn placed. Thus, the wiring conductor pattern layers are arranged so as to be substantially parallel with the substrate or powering/grounding layers and as to be overlapped with each other in a direction substantially perpendicular to the substrate or powering/grounding layers. Therefore, throughholes 18 for electrically connecting the two pairs of the wiring pattern conductors have only to be formed at the same position as viewed in a direction perpendicular to the powering/grounding layer, so that the entire number of throughholes can be reduced. This facilitates improvement of the production yield of semiconductor integrated circuit structures and suppress cross-talk with other wiring conductor pattern layers.

Figure 3B:
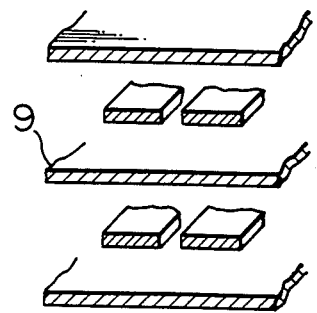

The characteristic impedance of the wiring conductor pattern layers should be preferably high for less power consumption. The structure shown in FIG. 5A provides a meritorious effect of a higher characteristic impendance of the wiring conductor pattern layers than the conventional wiring conductors in the structure of FIG. 3B, assuming that the number and sizes of the wiring conductors and the space or the thickness of an insulating layer accommodating the wiring conductors are identical with those in FIGS. 3B and 5A. This is because, when two conductors are arranged one above the other, another powering/grounding layer will have to be provided therebetween according to FIG. 3B structure while no such layer will be necessary in FIG. 5A structure in which the two conductors are paired, and therefore, the distance (b in FIG. 5B) between the two powering/grounding layers can be made relatively large in FIG. 5A structure than in FIG. 3B structure. This embodiment also provides an advantage of easiness of the production process because of the small number of layers.

Figure 7:
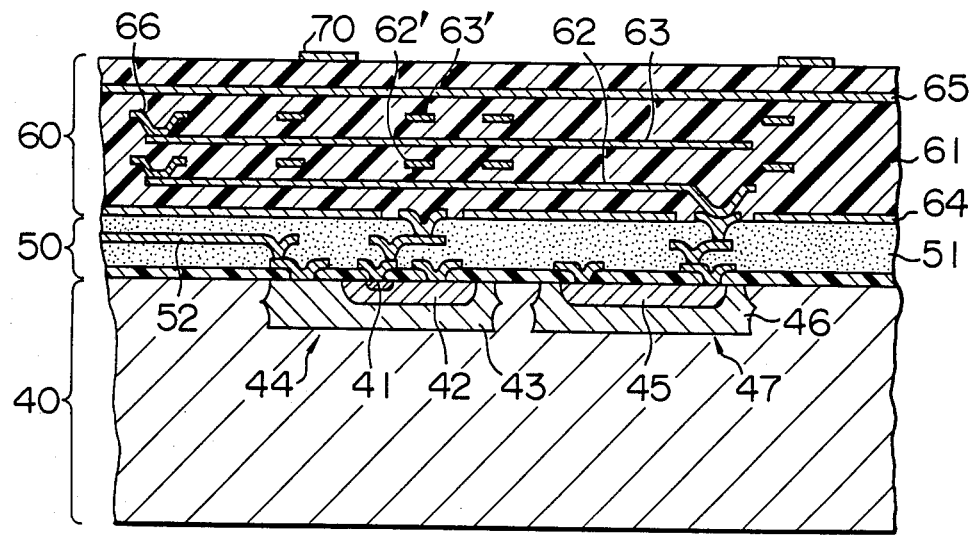
FIG. 7 is a cross section a semiconductor structure according to another embodiment of this invention.

Referring to FIG. 7, showing another embodiment of this invention in cross section, there is formed in a p-type Si substrate 40 a circuit for generating a pair of complementary signals including a transistor 44, a resistor 47 and others (not shown) by the usual bipolar LSI manufacturing process. The transistor 44 includes an n-type collector region 43, a p-type base region 42 formed in the region 43, a n-type emitter region 41 formed in the region 42. The resistor 44 includes a p-type region 45 formed in an n-type region 46. After formation of necessary electric contacts to the signal generating circuit, a first insulating layer 51 of $SiO_2$ is formed on the substrate 40 by sputtering. There are formed wiring conductors 52 of Al, Al-Si or the like in the first insulating layer 51, thereby constituting a first wiring layer 50. By the use of, e.g., a polyimide resin such as PIQ as a second insulating layer 61 on the first insulating layer 51, pairs of conductor pattern layers 62 and 63, 62' and 63', ... and a pair of powering/grounding layers 64 and 65 are formed in the second insulating layer 61, thereby constituting a second wiring layer 60. The conductor pattern layers and powering/grounding layers in the second insulating layer 61 may be made of Al, Cu or the like. The conductor pattern layer pairs in the second wiring layer 60 are electrically connected where necessary by through holes 66. Connection pads 70 are formed on the second insulating layer 61 for externally delivering or receiving signals.

The conductors 52 in the first wiring layer 50 have a smaller lateral width than that of the conductor pattern layers 62 and 63 (62' and 63') in the second wiring layer 60, so that more conductors may be formed in the first wiring layer 50 than in the second wiring layer 60. Incidentally, the termination resistors may be formed in the substrate 40 during the above-mentioned usual bipolar LSI manufacturing process.

In this structure, the wiring conductors in the first wiring layer 50 have rather short lengths and are arranged for the near end termination while the conductor pattern layers in the second wiring layer 60 have large lengths and are arranged for the far end termination. That is, near end termination and far end termination are distinctly employed for the small length conductors and the large length conductors. As a result, an additional advantage is provided such that a signal delay time caused by wiring conductors is made smaller as compared with the prior art structure in which the near end termination is employed both for small length wiring conductors and for large length wiring conductors.

We claim:

1. A semiconductor integrated circuit structure comprising:
    a semiconductor substrate having such a large area as being adapted for a large scale integration;
    circuit means formed in said semiconductor substrate for generating a pair of complementary signals in a phase-inverted relation with each other;
    a first common potential level layer formed above said substrate and electrically insulated from said substrate;
    a second common potential level layer formed above said first common potential level layer with an electrically insulating layer interposed therebetween; and
    at least one pair of electric conductor pattern layers formed in a spaced relation with each other in said insulating layer, said pair of conductor pattern layers being in electrical connection with said circuit means for conducting said pair of complementary signals to a desired point in said insulating layer and being arranged so as to be overlapped with each other in a direction substantially perpendicular to said substrate and so as to be substantially parallel with said substrate.

2. A structure according to claim 1, further comprising a pair of first termination resistances in electrical connection with said pair of conductor pattern layers, respectively, at said desired point in said insulating layer.

3. A structure according to claim 2, further comprising a second termination resistance interconnected between said pair of first termination resistances.

4. A structure according to claim 3, in which said first and second termination resistances are diffused resistances.

5. A structure according to claim 1, in which said insulating layer is made of a polyimide resin.

6. A structure according to claim 1, further comprising another pair of electric conductor pattern layers formed in a spaced relation with each other in said insulating layer and arranged so as to be overlapped with each other in a direction substantially perpendicular to said substrate and so as to be parallel with said substrate, said another pair of electric conductor pattern layers crossing the first-mentioned pair with one conductor pattern layer of one of said pair over one conductor pattern layer of the other pair so that part of said insulating layer is interposed between every adjacent two conductor pattern layers at the crossing, inter-level contact conductors being formed extending, perpendicularly to said substrate, between adjacent first two conductor pattern layers and between second adjacent two conductor pattern layers, respectively.

* * * * *